US008386982B1

(12) United States Patent
Mishra et al.

(10) Patent No.: US 8,386,982 B1
(45) Date of Patent: Feb. 26, 2013

(54) SYSTEM, METHOD, AND COMPUTER PROGRAM PRODUCT FOR PIN ASSIGNMENT IN AN ELECTRONIC DESIGN (75) Inventors: Anil Kumar Mishra, Noida (IN); Shashank Prasad, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/158,754

(22) Filed: Jun. 13, 2011

(51) Int. Cl.
*G06F 17/50* (2006.01)
(52) U.S. Cl. .................... 716/124; 716/132; 716/137
(58) Field of Classification Search ............... 716/124, 716/132, 137
See application file for complete search history.

(56) References Cited

U.S. PATENT DOCUMENTS

| 5,128,871 | A  | * | 7/1992  | Schmitz ........................ 716/102 |
| 5,987,086 | A  | * | 11/1999 | Raman et al. ................. 716/120 |
| 6,192,431 | B1 | * | 2/2001  | Dabral et al. .................... 710/62 |
| 6,823,501 | B1 | * | 11/2004 | Dahl .............................. 716/122 |
| 7,062,729 | B2 | * | 6/2006  | Gray et al. .................... 716/122 |
| 2001/0034873 | A1 | * | 10/2001 | Arsintescu ....................... 716/8 |
| 2007/0150846 | A1 | * | 6/2007  | Furnish et al. ................... 716/8 |
| 2009/0300556 | A1 | * | 12/2009 | Gee et al. ........................ 716/1 |
| 2009/0313596 | A1 | * | 12/2009 | Lippmann et al. .............. 716/12 |

* cited by examiner

*Primary Examiner* — Naum Levin
(74) *Attorney, Agent, or Firm* — Holland & Knight LLP; Mark H. Whittenberger, Esq.

(57) ABSTRACT

The present disclosure relates to a computer-implemented method for assigning pins in an electronic design. The method may include generating a pin list associated with the electronic design, the pin list having a one or more pins that are directly and indirectly connected with at least one of a master partition and a clone partition. The method may further include sorting one or more pins within the pin list based upon, at least in part, a number of local connections to generate a sorted pin list and selecting a first pin having a highest number of local connections of the sorted pin list as a reference pin. The method may also include selecting a partition of the reference pin, as a reference partition and identifying one or more alignment zones for every connected pair of pins in the sorted pin list. The method may further include transforming all alignment zones to the reference partition using a depth-first-search.

30 Claims, 6 Drawing Sheets

SYSTEM, METHOD, AND COMPUTER PROGRAM PRODUCT FOR PIN ASSIGNMENT IN AN ELECTRONIC DESIGN

FIELD OF THE INVENTION

The present disclosure relates to electronic design, and more specifically, to pin assignment in an electronic design.

DISCUSSION OF THE RELATED ART

A printed circuit board (PCB) provides a surface to mount and interconnect electronic components. In general, a PCB consists of an insulating sheet onto which conductive paths are printed. The insulating sheet, also referred to as the substrate, is often composed of fiberglass-reinforced epoxy composite. The printed conductive paths, also referred to as traces, are often composed of copper. After the PCB has been manufactured, electronic components are mounted on the substrate and attached to the traces usually by soldering. As PCBs are rugged, inexpensive, and highly reliable, they are used extensively in many types of electronic equipment and systems.

There are many different types of electronic components that can be mounted and interconnected using a PCB. Examples of such electronic components include memory chips, transistors, resistors, processor chips, and programmable devices such as an FPGA. An FPGA is a large-scale integrated circuit that can be programmed and re-programmed after it is manufactured. Thus, an FPGA is an example of an electronic component that is not limited to a predetermined, unchangeable hardware function.

A pin often serves as a connection point to an electronic component. In other words, when connecting two electronic components together, it is a pin of the first electronic component that is being connected (e.g., via a copper trace) to a pin of the second electronic component. An electronic component may have any number of pins. Some electronic components have fewer than a dozen pins, while other electronic components, an FPGA for example, may have over 1,000 pins.

Each pin of an electrical component has both an electrical definition and a logical definition that must be observed when connecting the pin. The electrical definition indicates voltage ranges, current ranges, frequency ranges, rise times, fall times and other electrical properties well known in the art under which the pin and portion of the electronic component associated with the pin are designed to operate. Failure to observe an electrical definition may result in undesirable performance and even damage to the electronic component. The logical definition of a pin indicates the function of the pin. For example, the pin may be a signal input pin, a signal output pin, a data pin, an address pin, a clock input pin, a power pin, a configure pin, or another type of pin well known in the art. Pins may be connected based on both the electrical definition and the logical definition. Clearly, a signal input pin on a first electronic component should not be connected to a signal input pin on a second electronic component. Likewise, a pin restricted to an operating frequency of less than 10 MHz should not be connected to a pin that outputs or requires a signal with a frequency exceeding 200 MHz.

FPGA IPs (Intellectual Property Blocks) are predefined complex functions and circuits that have been tested and optimized to speed up the design process and to simplify the design of complex systems in FPGAs. Use of pre-validated IPs makes design time shorter and reduces the risk as well as the associated unknowns in a particular design.

Many FPGA vendors provide IP generation tools. These tools may be used to generate the pin locations (in addition to register-transfer-level (RTL) for FPGA) for some IPs that interface with other components on the board. Such pinouts are generally mapped to correct pin types for connecting to the external components or buses, but are not optimized for board level routing and placement of the connected components (e.g., interfaces). Optimizing pinouts by ignoring this aspect could lead to design issues at the board level such as reduced signal integrity due to non-optimal routing and higher number of printed circuit board (PCB) layers.

In some cases, a master/clone partition may be utilized to shorten the turnaround on a particularly large design. This type of arrangement may be used to allow a designer to reuse block implementation efforts. In this way, the same block may be placed at different locations having different orientations as master and clone. It may also mean that the clone partition's pin always follow the master partitions' pin location. Determining the optimum pin assignment for the master/clone partition thus minimizing any misalignment and/or deviation is a concern.

SUMMARY OF INVENTION

In one or more embodiments of the present disclosure, a computer-implemented method for assigning pins associated with an electronic circuit design is provided. In some embodiments the method may include generating a pin list associated with the electronic design, the pin list having a one or more pins that are directly and indirectly connected with at least one of a master partition and a clone partition. The method may further include sorting one or more pins within the pin list based upon, at least in part, a number of local connections to generate a sorted pin list and selecting a first pin having a highest number of local connections of the sorted pin list as a reference pin. The method may also include selecting a partition of the reference pin, as a reference partition and identifying one or more alignment zones for every connected pair of pins in the sorted pin list. The method may further include transforming all alignment zones to the reference partition using a depth-first-search.

One or more of the following features may be included. In some embodiments, the method may include identifying a common alignment zone at the reference partition, based on the transformation of all alignment zones. The method may further include, if the common alignment zone is available, placing the reference pin on the reference partition in the common alignment zone. The method may also include placing the remaining pins of the pin list. In some embodiments, placing may include locating one or more connected pins to the reference pin, and for each connected pin, snapping a reference pin location to the partition of the connected pin and placing the connected pin at this snapped location. The method may also include assuming one or more connected pins as the reference pin. In some embodiments, if the common alignment zone is not available, the method may include determining the largest span between successive alignment zones, determining a midpoint at its opposite span, and placing the reference pin at this location on the reference partition. The method may further include placing the remaining pins of the pin list. In some embodiments, placing may include transforming all alignment zones to the partition of this pin using a depth-first-search, determining the largest span between successive alignment zones, determining a midpoint at its opposite span, and placing this pin at this location on the partition. The method may further include iteratively repeating the placing operation for placing this pin, and at least one remaining pin of the pin list.

In one or more embodiments of the present disclosure, a system for assigning pins associated with an electronic design is provided. In some embodiments, the system may include a computing device having at least one processor configured to generate a pin list associated with the electronic design, the pin list having a one or more pins that are directly and indirectly connected with at least one of a master partition and a clone partition. The at least one processor may be further configured to sort one or more pins within the pin list based upon, at least in part, a number of local connections to generate a sorted pin list and selecting a first pin having a highest number of local connections of the sorted pin list as a reference pin. The at least one processor may be further configured to select a partition of the reference pin, as a reference partition and identifying one or more alignment zones for every connected pair of pins in the sorted pin list. The at least one processor may be further configured to transform all alignment zones to the reference partition using a depth-first-search.

One or more of the following features may be included. In some embodiments, the at least one processor may be further configured to identify a common alignment zone at the reference partition, based on the transformation of all alignment zones. The at least one processor may be further configured to, if the common alignment zone is available, place the reference pin on the reference partition in the common alignment zone. The at least one processor may be further configured to place the remaining pins of the pin list. In some embodiments, placing may include locating one or more connected pins to the reference pin, and for each connected pin, snapping a reference pin location to the partition of the connected pin and placing the connected pin at this snapped location. The at least one processor may be further configured to assume one or more connected pins as the reference pin. In some embodiments, if the common alignment zone is not available, the at least one processor may be further configured to determine the largest span between successive alignment zones, determining a midpoint at its opposite span, and placing the reference pin at this location on the reference partition. The at least one processor may be further configured to place the remaining pins of the pin list. In some embodiments, placing may include transforming all alignment zones to the partition of this pin using a depth-first-search, determining the largest span between successive alignment zones, determining a midpoint at its opposite span, and placing this pin at this location on the partition. The at least one processor may be further configured to iteratively repeat the placing operation for placing this pin, and at least one remaining pin of the pin list.

In one or more embodiments of the present disclosure, a computer-readable storage medium for assigning pins associated with an electronic design is provided. The computer-readable storage medium may have stored thereon instructions that when executed by a machine result in a number of operations. Some operations may include generating a pin list associated with the electronic design, the pin list having a one or more pins that are directly and indirectly connected with at least one of a master partition and a clone partition. Operations may further include sorting one or more pins within the pin list based upon, at least in part, a number of local connections to generate a sorted pin list and selecting a first pin having a highest number of local connections of the sorted pin list as a reference pin. Operations may also include selecting a partition of the reference pin, as a reference partition and identifying one or more alignment zones for every connected pair of pins in the sorted pin list. Operations may further include transforming all alignment zones to the reference partition using a depth-first-search.

One or more of the following features may be included. In some embodiments, operations may include identifying a common alignment zone at the reference partition, based on the transformation of all alignment zones. Operations may further include, if the common alignment zone is available, placing the reference pin on the reference partition in the common alignment zone. Operations may also include placing the remaining pins of the pin list. In some embodiments, placing may include locating one or more connected pins to the reference pin, and for each connected pin, snapping a reference pin location to the partition of the connected pin and placing the connected pin at this snapped location. Operations may also include assuming one or more connected pins as the reference pin. In some embodiments, if the common alignment zone is not available, operations may include determining the largest span between successive alignment zones, determining a midpoint at its opposite span, and placing the reference pin at this location on the reference partition. Operations may further include placing the remaining pins of the pin list. In some embodiments, placing may include transforming all alignment zones to the partition of this pin using a depth-first-search, determining the largest span between successive alignment zones, determining a midpoint at its opposite span, and placing this pin at this location on the partition. Operations may further include iteratively repeating the placing operation for placing this pin, and at least one remaining pin of the pin list.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 1:
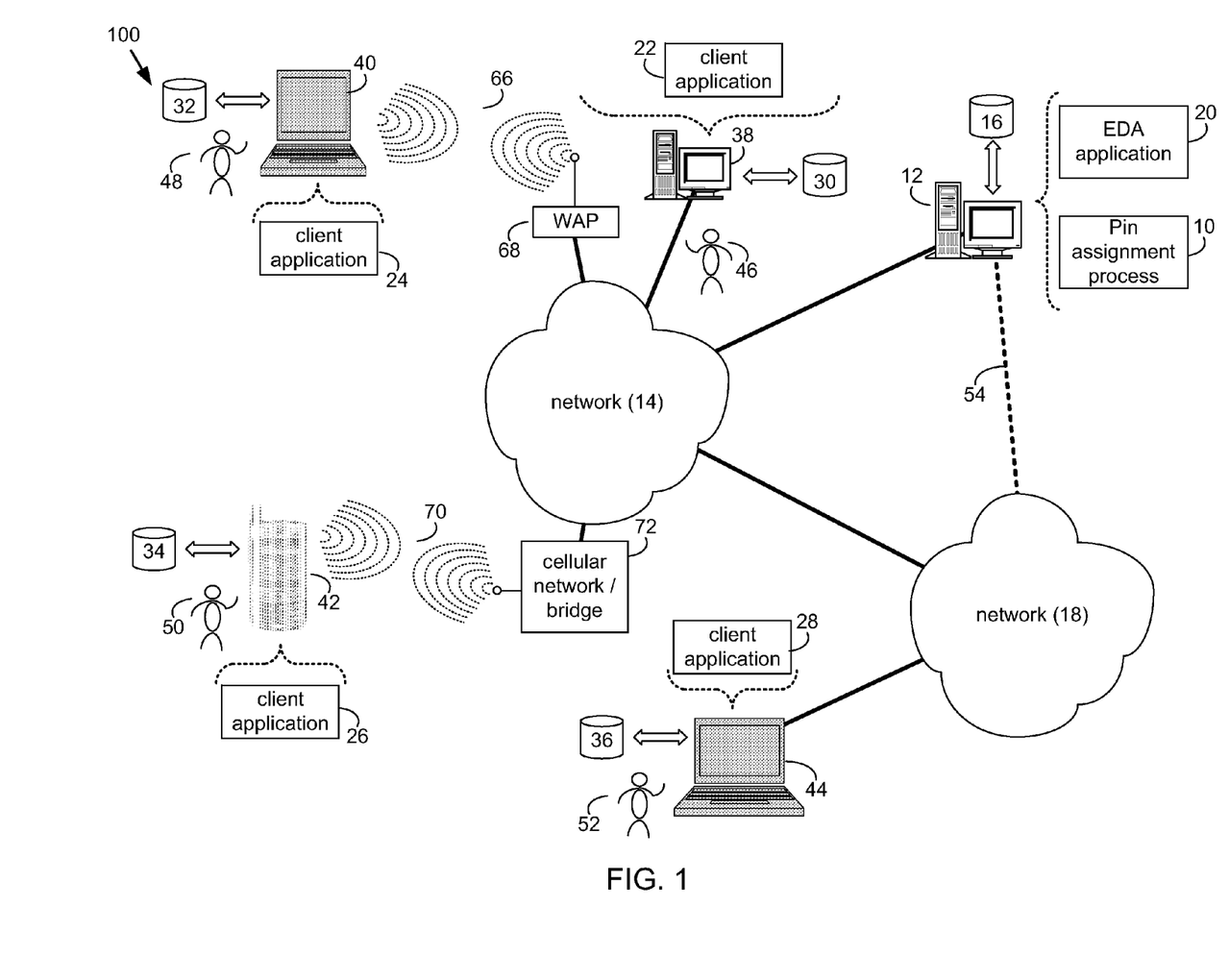
FIG. 1 is a system diagram depicting aspects of the pin assignment process in accordance with an embodiment of the present disclosure.

Referring to FIG. 1, there is shown pin assignment process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell®NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the pin assignment process may reside on and be executed, in whole or in part, by a client electronic device, such as a personal computer, notebook computer, personal digital assistant, or the like.

As will be discussed below in greater detail, pin assignment process 10 may include a method for programmable device synthesis associated with a printed circuit board (PCB) design. Pin assignment process 10 may include generating a pin list associated with the electronic design, the pin list having a one or more pins that are directly and indirectly connected with at least one of a master partition and a clone partition. The method may further include sorting one or more pins within the pin list based upon, at least in part, a number of local connections to generate a sorted pin list and selecting a first pin having a highest number of local connections of the sorted pin list as a reference pin. The method may further include identifying one or more additional pins of the sorted pin list, placing the first pin and the one or more additional pins and identifying a common alignment zone between at least two connected partitions of the electronic circuit design.

The instruction sets and subroutines of pin assignment process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic pin assignment. EDA application 20 may be referred to herein as a design tool.

Pin assignment process 10 may be a stand alone application, or may be an applet/application/script that may interact with and/or be executed within EDA application 20. In addition/as an alternative to being a server-side process, the pin assignment process may be a client-side process (not shown) that may reside on a client electronic device (described below) and may interact with an EDA client application (e.g., one or more of EDA client applications 22, 24, 26, 28). Further, the pin assignment process may be a hybrid server-side/client-side process that may interact with EDA application 20 and an EDA client application (e.g., one or more of client applications 22, 24, 26, 28). As such, the pin assignment process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize pin assignment process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

In some embodiments, the present disclosure is directed towards pin assignment in a top-down hierarchical flow of a physical design using master and clone partitions. Hierarchical flow may be used to shorten the turnaround time on large designs. In this way, the use of master and clone partitions may allow a designer to reuse block implementations. As a result, the same block may be placed at different locations having different orientations as master and clone. In some embodiments, this may result in a clone partition's pin always following the master partition's pin location. A problem the designer faces, however, is the optimum pin assignment for master and clone partition to minimize the deviation and/or average misalignment.

An existing approach to pin assignment for master and clone partition may involve checking the connectivity of nets of master and clone partition and to attempt to align them all at once. This may result in an aligned net for part of master/clone partition and unaligned net for rest of the master/clone partition. An alignment based pin assignment approach may be useful for a unique partition. However, aligning pins in the local context may have a non-aligning effect somewhere far off. For example, a net may be aligned in one scenario but unaligned in other scenarios. This may create large deviation from average misalignments and create issue in block implementation of master and clone partition. For example, in some cases the timing of the aligned net may be different from unaligned net.

In some embodiments, the present disclosure may utilize far sighted (e.g., non-local) connectivity for pin assignment of master and clone partition. The pin assignment process of the present disclosure may create a list of all pins that logically connect to each other directly and/or indirectly. Within the list pins may be sorted by their number of local connections. The pin assignment process may determine the alignment zone for every pin of the list and may transform an alignment zone to a pin's partition having the highest local connection. For example, if a common alignment zone is available then the pin assignment process may place pins in the common alignment zone. However, if a common alignment zone is not available, then the pin assignment process may be configured to determine the largest span between alignment zones on the partition and place the pin in the mid-point opposite of the largest span.

As a result, since pins are assigned using this far-sighted connectivity, the aligned pins will not create misalignment in other master and clone partitions. In this way, the far-sighted pin assignment for master and clone partition may minimize standard deviation with average misalignment. This creates comparable routing topologies for net connection of master and clone partitions.

Figure 2:
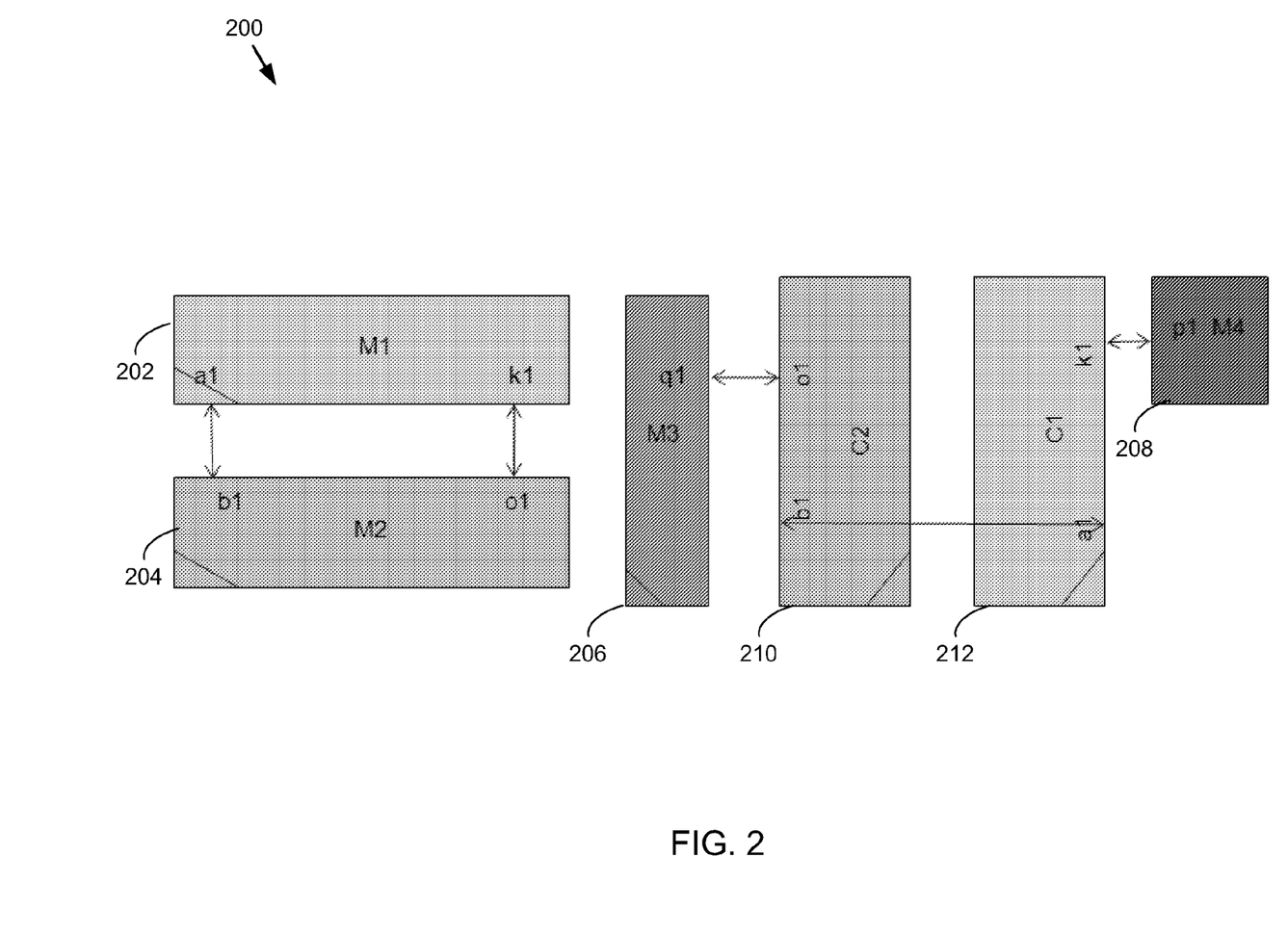
FIG. 2 is a diagram depicting an embodiment of the pin assignment process in accordance with the present disclosure.

Referring now to FIG. 2, an embodiment of the present disclosure showing an electronic design 200 having master/clone partitions. Design 200 includes master partitions 202, 204, 206, and 208 and clone partitions 210 and 212. In this particular embodiment, master partition 202 and clone partition 212 form a first master/clone pair. Similarly, master partition 204 and clone partition 210 form a second master/clone pair. Master partitions 206 and 208 may be single partitions. (i.e., M1(R0), C1(R90): Master clone pair, M2(R0), C2(R90): Master clone pair, M3, M4: Single partition).

As discussed in this document the term "far-sighted" may refer to an analysis of or a listing of pins including both direct and indirect connections. For example, a 2-pin net may directly connect two pins of the net. In a master/clone partition, the clone partition's pin may always follow the master partition's pin. For example, referring again to FIG. 2, pin (k1) of master partition 202 may be directly connected to pin (o1) of master partition 204, pin (o1) of clone partition 210 may be directly connected to pin (q1) of master partition 206, pin (k1) of clone partition 212 may be directly connected to pin (p1) of master partition 208. Additionally and/or alternatively, there is no direct connection between pin (o1) of clone partition 210 with pin (p1) of master partition 208 but they are indirectly connected.

As discussed above, the pin assignment process of the present disclosure may incorporate far-sighted (e.g., non-local) connectivity for pin assignment of master and clone partitions. In some embodiments, within the pin list, pins may be sorted by number of local connections and the first pin may be chosen as the reference pin. In this way, a pin having the highest number of local connections may be assigned first. Subsequent pins may be chosen from pin locally connected to placed pins in a chain form. In some embodiments, all pins of a pin list may be placed before placing pins from different pin list. This may provide optimal pin order for pin placement. For example, in FIG. 2 pin k1, pin o1, pin p1 and q1 may be kept in same pin list. In this particular embodiment, there is no direct connection between p1 and q1 but they are indirectly connected through the k1 and o1 pins. In some embodiment, when determining the alignment zone of the net, the alignment zone of connected partitions may be used.

The phrase "alignment zone" as used herein may refer to the part of the facing edge overlapping in both partition. For example, the alignment zone between clone partition 212 and master partition 208 may include the complete left edge of master partition 208 and the partial overlapping right edge of clone partition 212.

In some embodiments, the alignment zone of the net may dynamically shrink and start only from the first free pin slots on any layer on both corners. If there is no free pin slot on any layer then that alignment zone may be dropped. Due to the dynamic feature of the alignment zone pins may be placed in a spread manner. To avoid congestion at the corner of the alignment zone, pins may be placed in an effort to avoid both corners of the alignment zone.

Figure 3:
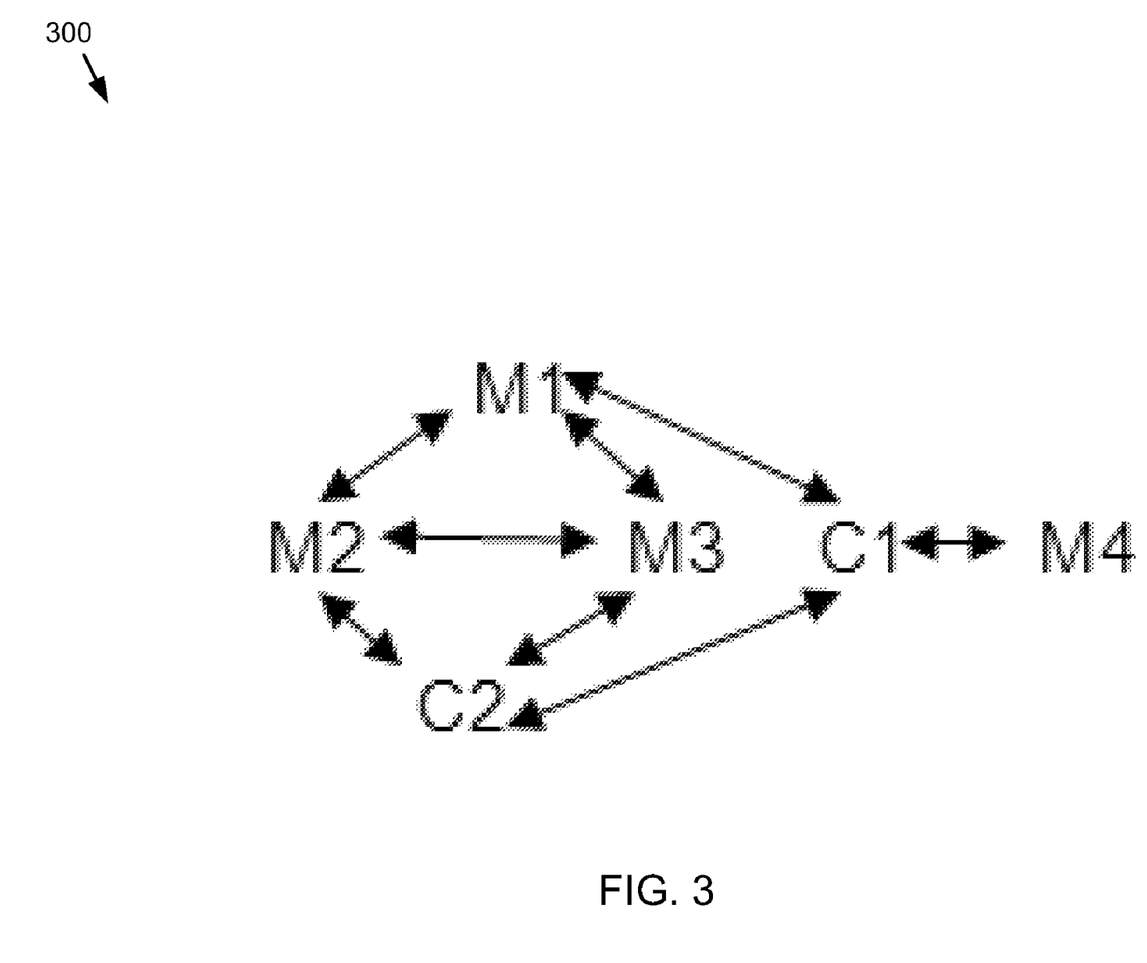
FIG. 3 is a diagram depicting an embodiment of the pin assignment process in accordance with the present disclosure.

In some embodiments, for alignment zone transformation from a partition to the reference partition a depth-first-search (DFS) may be used. DFS is an algorithm for traversing or searching a graph. In some embodiments, the pin assignment process of the present disclosure may utilize DFS for transforming alignment zone to a common reference partition. After transformation the common alignment zone may be determined. For example, the alignment zone between clone partition 212 and master partition 208 may be transformed to master partition 202. Similarly, the alignment zone between master partition 206 and clone partition 210 may be transformed to master partition 202. FIG. 3 depicts a flow diagram illustrating aspects of the depth first search of the present disclosure.

In some embodiments, all master and clone partitions may be kept as a node of the DFS. If there is an alignment zone available between partitions then an edge may be created between corresponding nodes. Additionally and/or alternatively, an edge may be created between nodes of master-clone partitions pairs.

In some embodiments, an alignment zone may be mapped to the adjacent partition or to the master/clone partition. In this way, the pin assignment of a master/clone partition may be performed in a number of phases. In one phase the pin assignment process may place only those pin lists where a common alignment zone is available. In another phase the pin assignment process may assign pins from the rest of the pin lists. This may improve the quality of results (QoR) of aligned pins. If a common alignment zone is missing, the pin assignment process may minimize standard deviation and/or average misalignment. This may be performed by determining the largest span between successive alignment zones. For example, by determining the midpoint opposite to the largest span. Additionally and/or alternatively, the direction of deviation left/right and/or up/down from an expected location to actual location of the first pin of the pin list. For other pins of the pin list the pin assignment process may search in the direction of deviation. This may help to minimize any crossover of flight lines from nets connected to pins of other pin lists.

As discussed herein, the present disclosure is applicable to pin assignment in the hierarchical flow of a physical design using master and clone partitions. Some embodiments of the present disclosure may read pins of the nets and create one or more lists of pins that logically connect to each other directly and/or indirectly using the master/clone relationship.

In some embodiments, the pin assignment process may consider 2-pin nets connected to an adjacent partition. The pin assignment process may generate multiple pin lists and pin lists may be sorted based upon a number of pins in the list. Within the pin list, pins may be sorted by the number of local connections. For example, pin k1, pin o1, pin p1 and pin q1 may be kept in pin list 1. Pin a1 and pin b1 may be kept in pin list 2. For the alignment zone of the net, the alignment zone of connected partitions may be used. The alignment zone associated with the first pin of the pin list may be kept as a reference. The alignment zone of other pins may be transformed on partition of the first pin.

Figure 4:
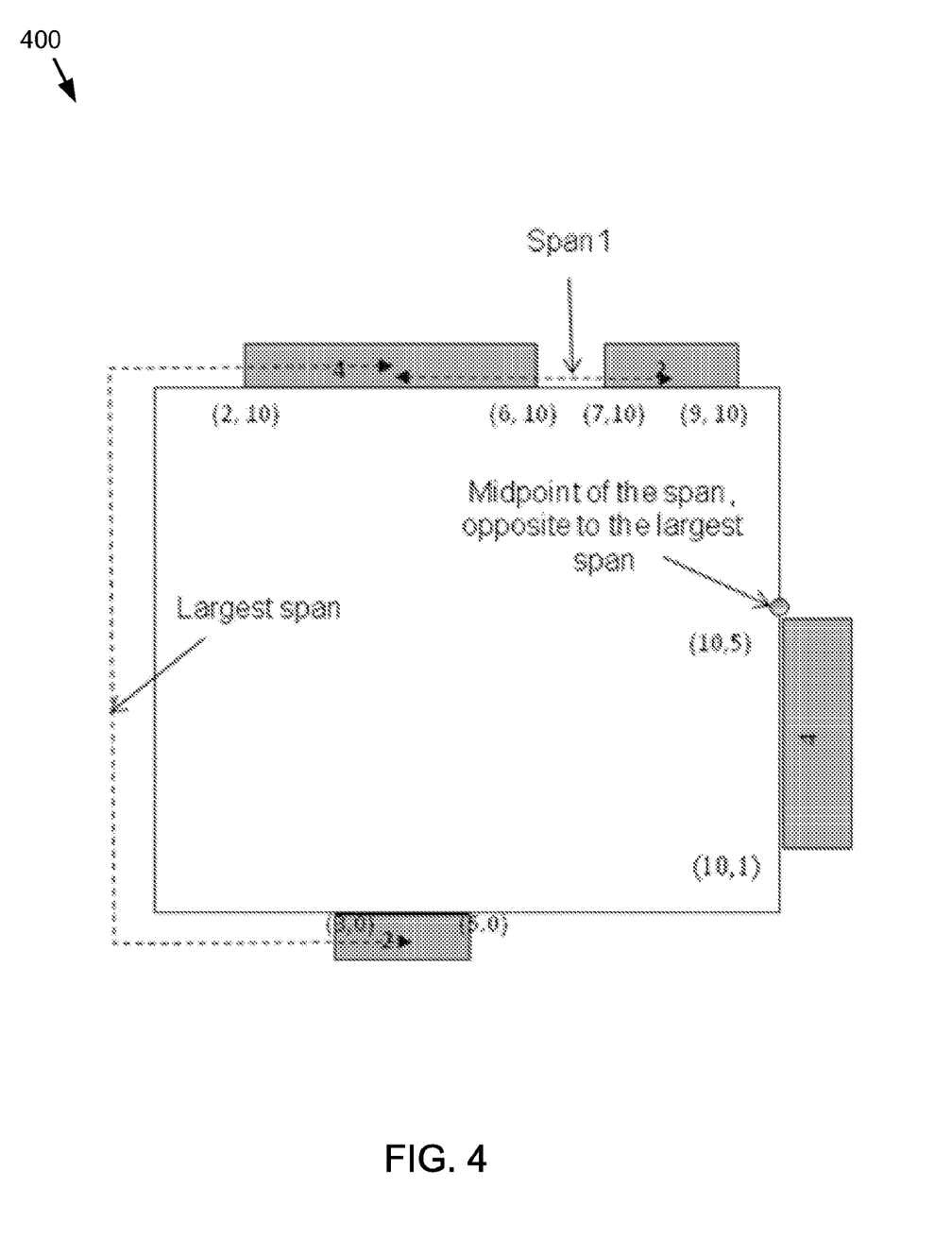
FIG. 4 is a diagram depicting an embodiment of the pin assignment process in accordance with the present disclosure.

Referring now to FIG. 4, in some embodiments after transformation if there is a common alignment zone among all pins of the pin list then the first pin may be assigned in the longest common alignment zone as aligned. For the rest of the pins in the pin list, if snapping is feasible from the placed location then the pin assignment process may assign at the snapped location. For example, assume pin list 1 is aligned. If a common alignment zone is not available pin assignment process may determine a span between mid-point of successive alignment zones and keep largest span. Here, the pin assignment process may place the pin at the midpoint opposite of the largest span as shown in FIG. 4.

FIG. 4. shows an embodiment 400 where a common alignment zone is not available. In this particular example, there are four alignment zones on the reference partition shown in the FIG. 4 with grey box and its width. One of the spans between successive alignment zones is marked as "Span 1". The largest span between successive alignment zones is shown in FIG. 4 as "Largest Span". The midpoint of the span opposite to the largest span is also shown in FIG. 4. In some embodiments, the reference pin may be placed at this location on the reference partition.

Figure 5:
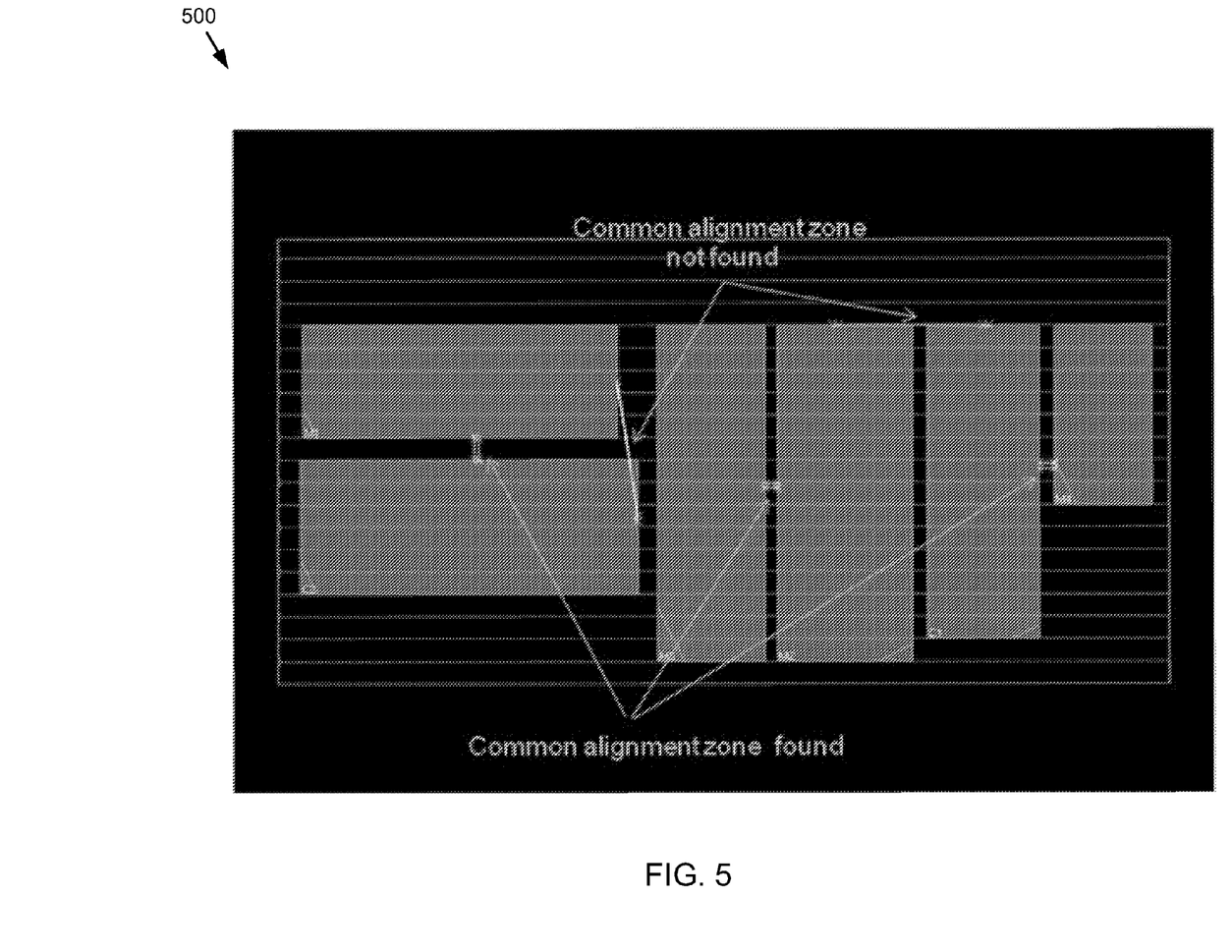
FIG. 5 is a diagram depicting an embodiment of the pin assignment process in accordance with the present disclosure.

Referring now to FIG. 5 an embodiment 500 depicting an arrangement similar to FIG. 2 is provided. In this embodiment, when a common alignment zone is available, pins (e.g. from pin list 1) may be placed in the common alignment zone and aligned. When a common alignment zone is not available, pins (e.g. from pin list 2) may be placed at the midpoint opposite to the largest span.

Embodiments of the present disclosure may be incorporated in whole or in part into any design tools. Some applications may include but are not limited to FPGAs, connectors, packages, etc.

Figure 6:
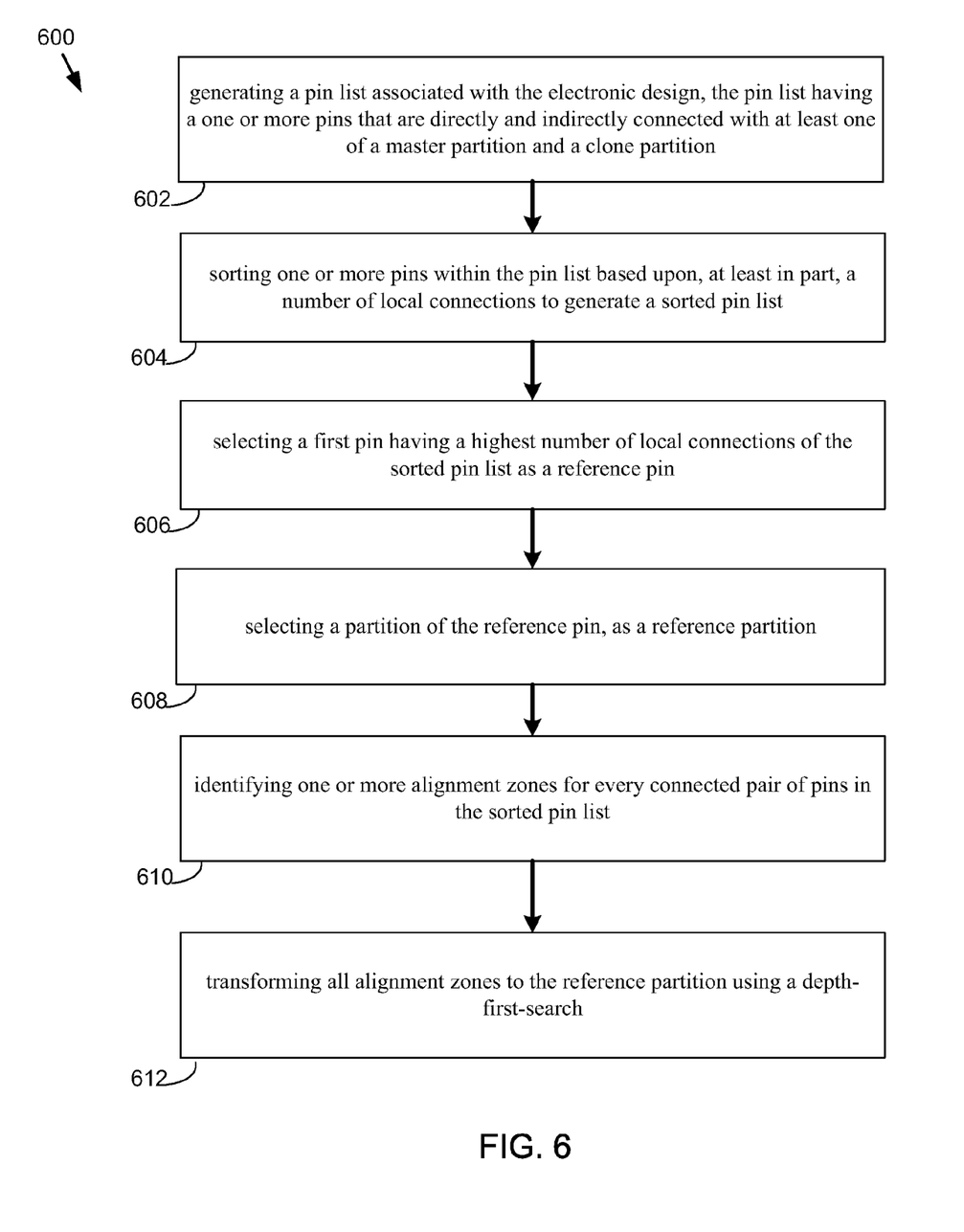
FIG. 6 is a flowchart depicting operations consistent with the pin assignment process of the present disclosure.

Referring now to FIG. 6, a flowchart 600 depicting operations consistent with an embodiment of the pin assignment process of the present disclosure is provided. Operations may include generating a pin list associated with the electronic design, the pin list having a one or more pins that are directly and indirectly connected with at least one of a master partition and a clone partition (602). The method may further include sorting one or more pins within the pin list based upon, at least in part, a number of local connections to generate a sorted pin list (604) and selecting a first pin having a highest number of local connections of the sorted pin list as a reference pin (606). The method may further include selecting a partition of the reference pin, as a reference partition (608), identifying one or more alignment zones for every connected pair of pins in the sorted pin list (610) and transforming all alignment zones to the reference partition using a depth-first-search (612).

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for assigning pins in an electronic design comprising:
    generating, using one or more processors, a pin list associated with the electronic design, the pin list having a one or more pins that are directly and indirectly connected with at least one of a master partition and a clone partition;
    sorting, using one or more processors, one or more pins within the pin list based upon, at least in part, a number of local connections to generate a sorted pin list;
    selecting, using one or more processors, a first pin having a highest number of local connections of the sorted pin list as a reference pin;
    selecting, using one or more processors, a partition associated with the reference pin, as a reference partition;
    identifying, using one or more processors, one or more alignment zones for every connected pair of pins in the sorted pin list; and
    transforming, using one or more processors, all alignment zones to the reference partition using a depth-first-search.

2. The method of claim 1 further comprising:
    identifying a common alignment zone at the reference partition, based on the transformation of all alignment zones.

3. The method of claim 2 further comprising, if the common alignment zone is available, placing the reference pin on the reference partition in the common alignment zone.

4. The method of claim 3, further comprising placing the remaining pins of the pin list.

5. The method of claim 4, wherein placing includes locating one or more connected pins to the reference pin, and for each connected pin, snapping a reference pin location to the partition of the connected pin and placing the connected pin at this snapped location.

6. The method of claim 5, further comprising iteratively repeating the placing operation for placing this pin, and at least one remaining pin of the pin list.

7. The method of claim 4, further comprising assuming one or more connected pins as the reference pin.

8. The method of claim 2 further comprising, if the common alignment zone is not available, determining the largest span between successive alignment zones, determining a midpoint at its opposite span, and placing the reference pin at this location on the reference partition.

9. The method of claim 8, further comprising placing the remaining pins of the pin list.

10. The method of claim 9, wherein placing includes transforming all alignment zones to the partition of this pin using a depth-first-search, determining the largest span between successive alignment zones, determining a midpoint at its opposite span, and placing this pin at this location on the partition.

11. A system for assigning pins in an electronic design comprising:
   a computing device having at least one processor configured to generate a pin list associated with the electronic design, the pin list having a one or more pins that are directly and indirectly connected with at least one of a master partition and a clone partition, the at least one processor further configured to sort one or more pins within the pin list based upon, at least in part, a number of local connections to generate a sorted pin list, the at least one processor further configured to select a first pin having a highest number of local connections of the sorted pin list as a reference pin, the at least one processor further configured to select a partition of associated with the reference pin, as a reference partition, the at least one processor further configured to identify one or more alignment zones for every connected pair of pins in the sorted pin list, the at least one processor further configured to transform all alignment zones to the reference partition using a depth-first-search.

12. The system of claim 11 wherein the at least one processor is further configured to identify a common alignment zone at the reference partition, based on the transformation of all alignment zones.

13. The system of claim 12 wherein the at least one processor is further configured to, if the common alignment zone is available, place the reference pin on the reference partition in the common alignment zone.

14. The system of claim 13, wherein the at least one processor is further configured to place the remaining pins of the pin list.

15. The system of claim 14, wherein placing includes locating one or more connected pins to the reference pin, and for each connected pin, snapping a reference pin location to the partition of the connected pin and placing the connected pin at this snapped location.

16. The system of claim 15, wherein the at least one processor is further configured to iteratively repeat the placing operation for placing this pin, and at least one remaining pin of the pin list.

17. The system of claim 14, wherein the at least one processor is further configured to assume one or more connected pins as the reference pin.

18. The system of claim 12 further comprising, if the common alignment zone is not available, determining the largest span between successive alignment zones, determining a midpoint at its opposite span, and placing the reference pin at this location on the reference partition.

19. The system of claim 18, wherein the at least one processor is further configured to place the remaining pins of the pin list.

20. The system of claim 19, wherein placing includes transforming all alignment zones to the partition of this pin using a depth-first-search, determining the largest span between successive alignment zones, determining a midpoint at its opposite span, and placing this pin at this location on the partition.

21. A non-transitory computer-readable storage medium for assigning pins associated with an electronic design, the computer-readable storage medium having stored thereon instructions that when executed by a machine result in the following operations:
   generating a pin list associated with the electronic design, the pin list having a one or more pins that are directly and indirectly connected with at least one of a master partition and a clone partition;
   sorting one or more pins within the pin list based upon, at least in part, a number of local connections to generate a sorted pin list;
   selecting a first pin having a highest number of local connections of the sorted pin list as a reference pin;
   selecting a partition of associated with the reference pin, as a reference partition;
   identifying one or more alignment zones for every connected pair of pins in the sorted pin list; and
   transforming all alignment zones to the reference partition using a depth-first-search.

22. The computer-readable storage medium of claim 21 wherein operations further comprise:
   identifying a common alignment zone at the reference partition, based on the transformation of all alignment zones.

23. The computer-readable storage medium of claim 22 wherein operations further comprise:
   if the common alignment zone is available, placing the reference pin on the reference partition in the common alignment zone.

24. The computer-readable storage medium of claim 23, wherein operations further comprise:
   placing the remaining pins of the pin list.

25. The computer-readable storage medium of claim 24, wherein placing includes locating one or more connected pins to the reference pin, and for each connected pin, snapping a reference pin location to the partition of the connected pin and placing the connected pin at this snapped location.

26. The computer-readable storage medium of claim 25, wherein operations further comprise:
   iteratively repeating the placing operation for placing this pin, and at least one remaining pin of the pin list.

27. The computer-readable storage medium of claim 24, wherein operations further comprise:
   assuming one or more connected pins as the reference pin.

28. The computer-readable storage medium of claim 22 wherein operations further comprise:
   if the common alignment zone is not available, determining the largest span between successive alignment zones, determining a midpoint at its opposite span, and placing the reference pin at this location on the reference partition.

29. The computer-readable storage medium of claim 28, wherein operations further comprise:
   placing the remaining pins of the pin list.

30. The computer-readable storage medium of claim 29, wherein placing includes transforming all alignment zones to the partition of this pin using a depth-first-search, determining the largest span between successive alignment zones, determining a midpoint at its opposite span, and placing this pin at this location on the partition.

* * * * *